United States Patent
Katayama et al.

(10) Patent No.: US 6,757,349 B1
(45) Date of Patent: Jun. 29, 2004

(54) PLL FREQUENCY SYNTHESIZER WITH LOCK DETECTION CIRCUIT

(75) Inventors: Satoshi Katayama, Kasugai (JP); Takehito Doi, Kasugai (JP); Shinji Saito, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/106,715

(22) Filed: Jun. 29, 1998

(30) Foreign Application Priority Data

Jan. 16, 1998 (JP) .......................................... 10-006649

(51) Int. Cl.⁷ .................................................. H04L 7/06
(52) U.S. Cl. ...................................... 375/376; 327/147
(58) Field of Search ................................ 375/376, 375, 375/327, 373, 371, 356; 331/1 R; 327/141, 147, 150, 153, 156, 158, 159, 161, 148

(56) References Cited

U.S. PATENT DOCUMENTS

| | | | |
|---|---|---|---|
| 4,463,321 A | * 7/1984 | Horner | 331/1 R |
| 4,572,995 A | 2/1986 | Enami | |
| 4,751,469 A | 6/1988 | Nakagawa et al. | |
| 5,189,379 A | * 2/1993 | Saito et al. | 331/1 A |
| 5,260,979 A | * 11/1993 | Parker et al. | 375/366 |
| 5,355,037 A | * 10/1994 | Andersen et al. | 327/158 |
| 5,629,651 A | * 5/1997 | Mizuno | 331/34 |
| 6,005,904 A | * 12/1999 | Knapp et al. | 375/376 |

FOREIGN PATENT DOCUMENTS

| | | |
|---|---|---|
| EP | 0 433 120 | 6/1991 |
| EP | 0 673 121 | 9/1995 |
| GB | 2 180 708 | 4/1987 |
| GB | 2 268 645 | 1/1994 |
| JP | 9-200048 | 7/1997 |

* cited by examiner

Primary Examiner—Mohammad H. Ghayour
(74) Attorney, Agent, or Firm—Armstrong, Kratz, Quintos, Hanson & Brooks, LLP (57) ABSTRACT

A PLL frequency synthesizer including a lock detection circuit which detects whether or not the PLL is locked. First and second phase difference signals are generated from a reference signal and a compared signal by a phase comparator. The lock detection circuit determines the locked condition and generates a clock detection signal using only the first and second phase difference signals and does not require an external clock signal. The lock detection signal is generated independently of the frequencies of the reference signal and the compared signal.

21 Claims, 7 Drawing Sheets

PLL FREQUENCY SYNTHESIZER WITH LOCK DETECTION CIRCUIT

BACKGROUND OF THE INVENTION

1. Field of the Invention

The invention relates to a locking detection circuit used in a PLL (phase locked loop) frequency synthesizer for detecting whether the PLL is locked.

2. Description of the Related Art

Figure 1:
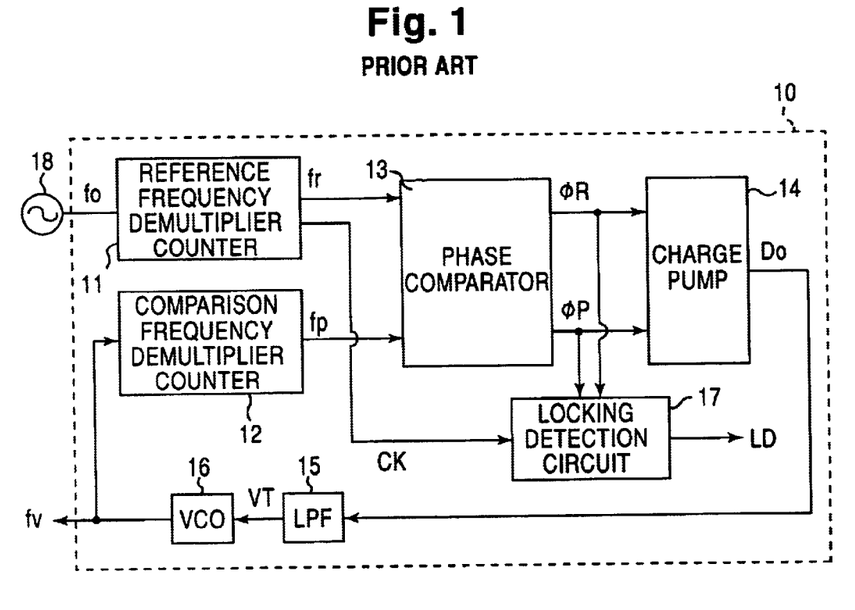
FIG. 1 is a block diagram of a conventional PLL frequency synthesizer.

Referring to FIG. 1, a conventional PLL frequency synthesizer 10 comprises a reference frequency demultiplier counter 11, a comparison frequency demultiplier counter 12, a phase comparator 13, a charge pump 14, a low pass filter (hereafter abbreviated as LPF) 15, a voltage controlled oscillator (hereafter abbreviated as VCO) 16 and a lock detection circuit 17.

The reference frequency demultiplier counter 11 produces a reference signal fr from a signal of generated by a crystal oscillator 18 through frequency demultiplication. The comparison frequency demultiplier counter 12 produces a compared signal fp obtained from an output signal fv from the VCO 16 through frequency demultiplication. The phase comparator 13 produces a first and a second phase difference signals φR, φP in accordance with a phase difference between the reference signal fr and the compared signal fp. On the basis of both phase difference signals φR, φP through the operations of the charge pump 14 and the LPF 15, the magnitude of voltage of a control signal VT which is input to the VCO 16 is changed. The PLL circuit 10 also operates to lock the frequency of the output signal fv from the VCO 16 to a desired frequency.

The lock detection circuit 17 receives the first and second phase difference signals φR, φP from the phase comparator 13, and also receives a reference clock signal CK from the reference frequency demultiplier counter 11 which is obtained by the frequency demultiplication of the signal of from the crystal oscillator 18 at a given ratio. The lock detection circuit 17, which operates in synchronism with the reference clock signal CK, detects whether the output signal fv is locked on the basis of the first and second phase difference signals φR, φP, and generates a locking detection signal LD having a level which depends on the result of such detection.

Figure 2:
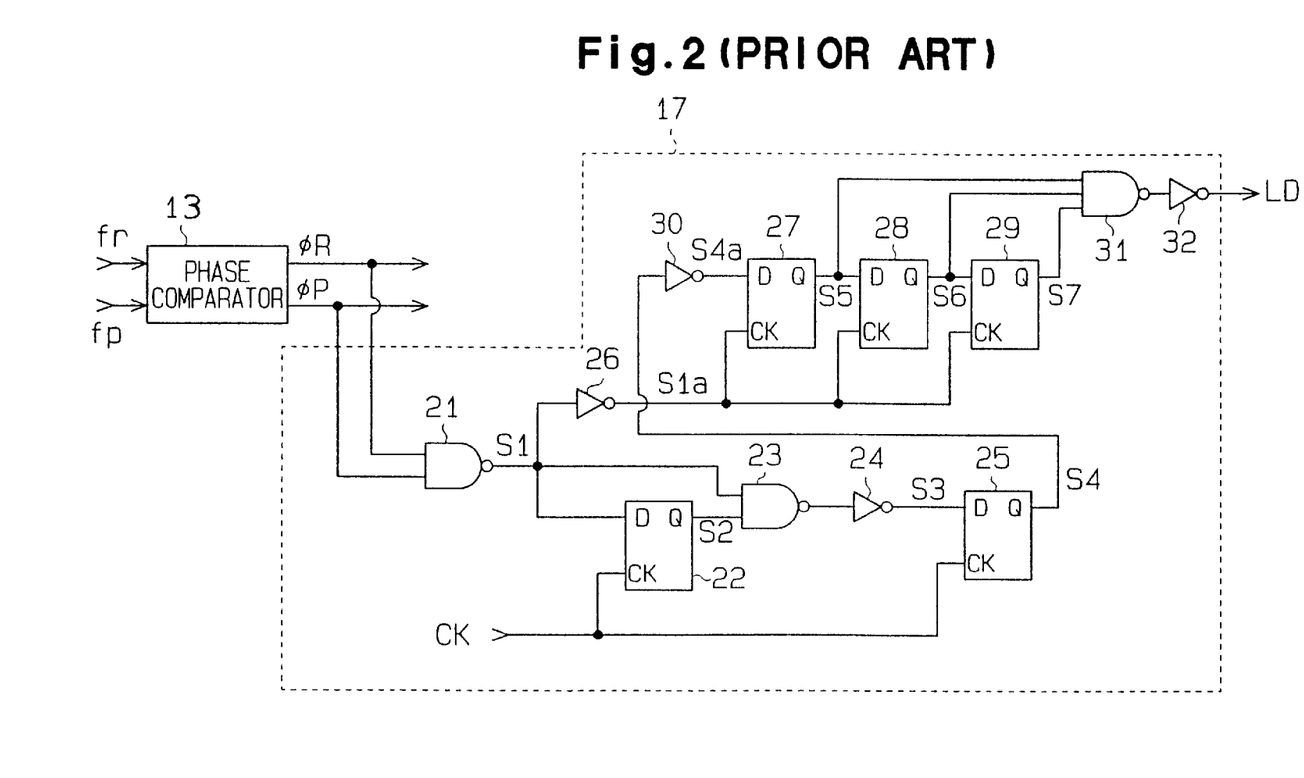
FIG. 2 is a circuit diagram of a conventional lock detection circuit.

Referring to FIG. 2, there is shown a specific circuit arrangement of the lock detection circuit 17. As shown, the lock detection circuit 17 includes a NAND circuit 21 that receives the first and the second phase difference signals φR, φP from the phase comparator 13 and provides an output signal S1 corresponding to the phase difference which is represented by each pulse width of the signals φR, φP. A data flip-flop circuit (hereafter referred to as FF circuit) 22 has a data terminal D for receiving the output signal S1 and a clock terminal CK for receiving the reference clock signal CK, and delivers an output signal S2 corresponding to the output signal S1 at its output terminal Q in synchronism with the rising edge of the reference clock signal CK.

A NAND circuit 23 receives the signals S1, S2, and delivers its to an inverter circuit 24. An inverted signal S3 is supplied to a data terminal D of an FF circuit 25 from the inverter circuit 24.

The FF circuit 25 has a clock terminal for receiving the reference clock signal CK, and provides an output signal S4 at its output terminal Q which depends on the inverted signal S3 in synchronism with the rising edge of the reference clock signal CK.

An inverter circuit 30 receives the output signal S4 and generates an inverted signal S4a. A synchronous counter is formed by a plurality of FF circuits 27, 28, 29. The first stage FF circuit 27 has a data terminal D, to which the inverted signal S4a is applied. Each of the FF circuits 27 to 29 has a clock terminal, to which an inverted signal S1a, formed by an inverter circuit 26 with the signal S1, is applied. The FF circuit 27 delivers an output signal S5 at its output terminal Q in synchronism with the rising edge of the inverted signal S1a (or the falling edge of the signal S1). The FF circuit 28 has a data terminal D, to which the output signal S5 is applied, and delivers an output signal S6 at its output terminal Q in synchronism with the falling edge of the output signal S1. The FF circuit 29 has a data terminal D, to which the output signal S6 is applied, and delivers an output signal S7 at its output terminal Q in synchronism with the falling edge of the output signal S1. The output signals S5, S6, and S7 are input to a NAND circuit 31, which then delivers the locking detection signal LD.

In the lock detection circuit 17, when one or both of the phase difference signals φR, φP has an L level, the NAND circuit 21 delivers the signal S1 which has an H level. The phase difference signals φR, φP each have a pulse width which is related to a phase difference between the reference signal fr and the compared signal fp, as will be further described later. Accordingly, the NAND circuit 21 delivers the signal S1 of the H level for a time interval corresponding to the phase difference between the signals fr, fp. The greater the phase difference between the signals fr, fp, the longer the pulse width of the signal S1 or vice versa.

The lock detection circuit 17 detects whether the PLL circuit 10 is locked on the basis of the number of rising edges of the reference clock signal CK which are input during a time interval corresponding to the pulse width of the output signal S1 or a time interval during which the NAND circuit 21 delivers the output signal S1 having the H level, and delivers the locking detection signal LD having a level which depends on the result of such detection. Thus it will be seen that the lock detection circuit 17 requires the reference clock signal CK of a higher frequency than the frequencies of the reference signal fr and the compared signal fp. Hence, the reference frequency demultiplier counter 11 produces the reference clock signal CK by the frequency demultiplication at a ratio which is less than the ratio of frequency demultiplication applied to the reference signal fr. Alternatively, the reference frequency demultiplier counter 11 may deliver the input crystal oscillator signal of directly as the reference clock signal CK.

The synchronous counter delivers the locking detection signal LD having an H level only when a phase coincidence is reached between the reference signal fr and the compared fp a number of times which is equal to the number of counter stages or more. This prevents the locking detection signal LD having the H level from being delivered from the lock detection circuit 17 for an accidental phase coincidence between the both signals fr, fp.

Digital mobile equipment generally requires the output signal fv of a higher frequency than analog mobile equipment, and consequently, the PLL circuit 10 produces the reference signal fr and the compared signal fp of higher frequencies, which then approach the frequency of the reference clock signal CK. This may result in a malfunctioning of the lock detection circuit 17.

For example, if the PLL circuit is locked between two consecutive rising edges of the reference clock signal CK, the lock detection circuit 17 may be unable to detect the locked condition, thus undesirably delivering the locking detection signal LD having the L level. Because the locking detection signal LD is used in controlling the charge pump 14, the LPF 15 or other external circuit, there are adverse influences upon the operation of the entire PLL circuit or external circuit, causing instability in the operation of the mobile equipment.

An object of the present invention is to provide a lock detection circuit and a PLL frequency synthesizer capable of reliably detecting a locked condition.

SUMMARY OF THE INVENTION

To achieve the above objective, the present invention provides a lock detection circuit for detecting whether a phase of a compared signal is locked with that of a reference signal based on first and second phase difference signals that represents a phase difference between the reference signal having a reference frequency and the compared signal having a preset frequency, the lock detection circuit comprising: a clock generating unit for receiving the first and the second phase difference signals and generating a detecting clock signal in synchronism with one of the first and the second phase difference signals, based on the first and the second phase difference signals; and a lock detecting unit for receiving the first and the second phase difference signals and the detecting clock signal, and detecting whether the phase of the compared signal is locked with the pulse of the reference signal based on the relationship between the detecting clock signal and the phase difference between the first and the second phase difference signals, and generating a lock detecting signal.

The present invention further provides a PLL synthesizer comprising: a voltage control oscillator for generating a frequency signal corresponding to a value of a control voltage signal; a comparison frequency demultiplier for generating a compared signal by frequency-demultiplying the frequency signal from the voltage control oscillator; a reference frequency demultiplier for generating a reference signal by frequency-demultiplying an oscillation signal; a phase comparator for receiving the reference signal and the compared signal to compare the phases thereof, and generating first and second phase difference signals, representing a relationship between the reference signal and the compared signal, based on a result of the phase comparison; a charge pump for converting the first and the second phase difference signals from the phase comparator to voltage signal; a low pass filter for receiving the voltage signal from the charge pump and generating the control voltage signal provided to the voltage control oscillator; and a lock detection circuit for detecting whether a phase of the compared signal is locked with a phase of the reference signal based on the first and second phase difference signals and generating a lock detecting signal, the lock detection circuit comprising: a clock generating unit for receiving the first and the second phase difference signals and generating a detecting clock signal in synchronism with one of the first and the second phase difference signals, based on the first and the second phase difference signals; and a lock detecting unit for receiving the first and the second phase difference signals and the detecting clock signal, and detecting whether the phase of the compared signal is locked with the phase of the reference signal based on the relationship between the detecting clock signal and the phase difference between the first and the second phase difference signals, and generating a lock detecting signal.

The present invention provides a lock detection circuit for use with a PLL frequency synthesizer for detecting a locked condition of the synthesizer, the synthesizer including a phase comparator which receives a reference signal and a compared signal and generates first and second phase difference signals therefrom, the lock detection circuit comprising: a phase difference detector which receives the first and second phase difference signals and generates a third phase difference signal which depends on a pulse width of each of the first and second phase difference signals; a clock generator circuit which receives the first and second phase difference signals and produces a detection clock signal synchronized with the third phase difference signal; a plurality of delay circuits connected in parallel with each other and in series with the phase difference detector, each of the delay circuits receiving the third phase difference signal and delaying the third phase difference signal by a different delay time; a plurality of switches connected in series with the plurality of delay circuits; a flip-flop circuit having a data input connected to the delay circuits for receiving the third phase difference signal delayed by a predetermined time period, a clock input connected to the clock generator circuit for receiving the detection clock signal, and a data output for providing a status signal, wherein one of the plurality of switches is selectively turned on to delay the third phase difference signal by a selected predetermined time period; and a locking counter connected to a data output of the flip-flop circuit for receiving the status signal and connected to the clock generator circuit for receiving the detection clock signal, the locking counter counting a number of pulses of the detection clock signal while the status signal is at a predetermined level and generating a locking detection signal therefrom, the locking detection signal indicating locked condition of the synthesizer.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with the objects and advantages thereof, may best be understood by reference to the following description of the presently preferred embodiments together with the accompanying drawings in which.

DETAILED DESCRIPTION OF THE PREFERRED EMBODIMENTS

In the drawings, like numerals are used to designate like elements throughout.

Figure 3:
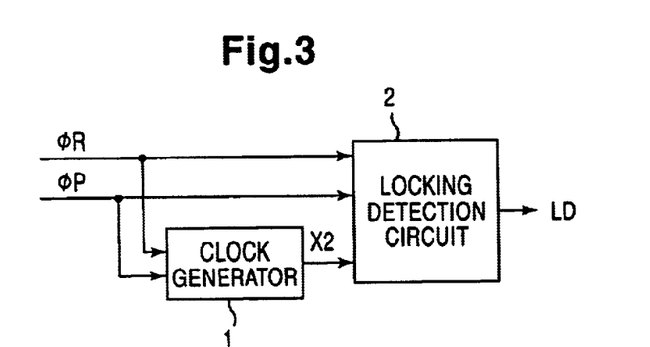
FIG. 3 is a block diagram of the present invention.

Referring to FIG. 3, the principle of the invention will de described first. A lock detection circuit comprises a clock generator 1 and a locking detector 2. A reference signal having a reference frequency is produced by a frequency demultiplication of an oscillation signal having a given frequency. A compared signal having a preset frequency is produced by a frequency demultiplication of a frequency signal from a voltage controlled oscillator. A first and a second phase difference signals φR, φP which are based on the result of a comparison between the phases of the reference signal and the compared signal are input to the clock generator 1, which then generates a detection clock signal X2 on the basis of the first and the second phase difference signals φR, φP, the detection clock signal X2 being synchronized with one of the phase difference signals φR, φP.

The first and second phase difference signals φP, φP and the detection clock signal X2 are input to the locking detector 2, which then detects whether the phase of the reference signal and the phase of the compared signal are locked to each other, on the basis of the relationship between the detection clock signal X2 and the phase difference between the first and second phase difference signals φR, φP, and delivers a locking detection signal Ld in accordance with the result of such detection. Because the detection clock signal X2 is synchronized with one of the first and second phase difference signals φR, φP, the locking detector 2 is able to detect a locked condition in a stable manner independently of the frequencies of the reference signal and the compared signal.

Figure 4:
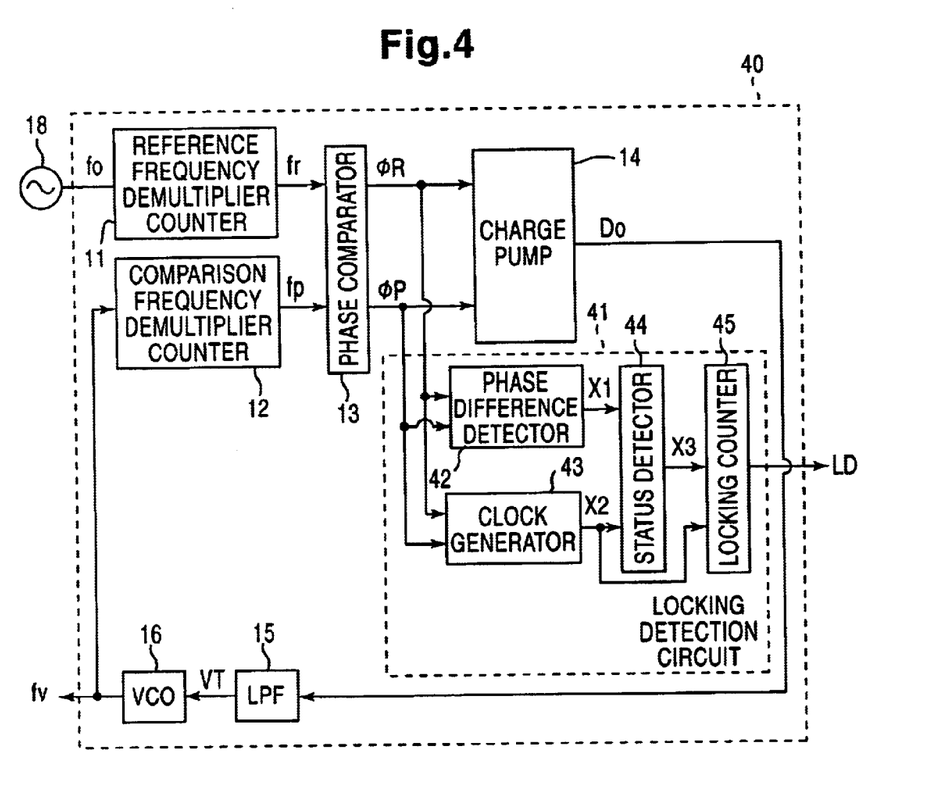
FIG. 4 is a block diagram of a PLL frequency synthesizer according to a first embodiment of the invention.

A PLL frequency synthesizer (hereafter referred to as PLL circuit) according to one embodiment of the invention will now be described with reference to FIGS. 4 to 7. As shown in FIG. 4, a PLL circuit 40 comprises a reference frequency demultiplier counter 11, a comparison frequency demultiplier counter 12, a phase comparator 13, a charge pump 14, a low pass filter (hereafter abbreviated as LPF) 15, a voltage controlled oscillator (hereafter abbreviated as VCO) 16 and a lock detection circuit 41.

The reference demultiplier counter 11 produces a reference signal fr by a frequency demultiplication of a crystal oscillator signal of having a natural frequency inherent in the oscillation of a crystal oscillator 18, and delivers the reference signal fr to the phase comparator 13. The comparison frequency demultiplier counter 12 produces a compared signal fp by a frequency demultiplication of an output signal fv from the VCO 16, and delivers the compared signal fp to the phase comparator 13.

The phase comparator 13 compares the phases of the reference signal fr and the compared signal fp, and produces a first phase difference signal φR, and a second phase difference signal φP, which depend on the result of comparison, and delivers the both signals φR, φP to the charge pump 14 and the lock detection circuit 41. It is to be noted that the phase comparator 13 delivers a phase difference signal of an increased pulse width for one of the reference signal fr and the compared signal fp which leads in phase. For example, if the reference signal fr leads in phase the compared signal fp, the phase comparator 13 delivers the first phase difference signal φR having a greater pulse width than the second phase difference signal φP. Accordingly, each of the first and the second phase difference signals φR, φP contains information representing a phase difference between the reference signal fr and the compared signal fp and information indicative of the signal which leads in phase. The charge pump 14 receives the first and the second phase difference signals φR, φP, and produces a Do output which depends on the both signals φR, φP.

The LPF 15 receives the Do output from the charge pump 14 and produces a control signal VT by smoothing the Do output by eliminating high frequency components therefrom. The VCO 16 receives the filtered control signal VT, and generates an output signal fv having a frequency which depends on the magnitude of voltage of the control signal VT. The output signal fv is fed back to the comparison frequency demultiplier counter 12 and is also made available for use by an external circuit (not shown).

If the frequency of the output signal fv is reduced below a desired frequency under the condition that it coincides with the desired frequency, the frequency of the compared signal fp will be lower than the frequency of the reference signal fr, producing a phase difference between the signals fr, fp. The phase comparator 13 then delivers the first and the second phase difference signals φR, φP each having a pulse width which depends on the phase difference between the signals fr, fp. The Do output generated by the charge pump. 14 depends on the pulse width of the respective phase difference signals φR, φP, which affects the magnitude of voltage of the control signal VT.

Conversely, when the frequency of the output signal fv is higher than the desired frequency, the frequency of the compared signal fp becomes higher than the frequency of the reference signal fr, producing a phase difference therebetween. The phase comparator 13 then delivers the first and the second phase difference signals φR, φP each having a pulse width which depends on the phase difference between the both signals fr, fp. The charge pump 14 delivers a Do output which depends on the pulse width of the respective phase difference signals φR, φP to the LPF 15, which then delivers the control signal VT having a lower magnitude of voltage on the basis of the Do output. The VCO 16 then delivers the output signal fv having a lower frequency on the basis of the control signal VT. In this manner, the PLL circuit 40 repeatedly operates to lock the frequency of the output signal fv delivered from the VCO 16 to the desired frequency.

The lock detection circuit 41 receives the first and the second phase difference signals φR, φP from the phase comparator 13. The lock detection circuit 41 detects whether the output signal fv is locked on the basis of only the first and the second phase difference signals φR, φP without using the reference clock signal CK from the reference frequency demultiplier counter 11, as done by the conventional lock detection circuit 17, and delivers a locking detection signal LD having a level which depends on the result of such detection.

More specifically, the lock detection circuit 41 according to the present embodiment detects a locked condition or an unlocked condition independently from the frequencies of the reference signal fr and the compared signal fp, and delivers a locking detection signal LD which depends on the detected condition. Accordingly, the lock detection circuit 41 is not influenced by the level of the frequency of the reference signal fr and the compared signal fp. This allows the PLL circuit 40 to accommodate for an output signal fv having a higher frequency as compared with the conventional PLL circuit 10.

The lock detection circuit 41 preferably comprises a phase difference detector 42, a clock generator 43, a status detector 44 and a locking counter 45. The phase difference detector 42 receives the first and second phase difference signals φR, φP, and produces a third phase difference signal X1 which depends on the pulse width of the phase difference signals φR, φP, and delivers the third phase difference signal X1 to the status detector 44. It is noted that the waveform of the third phase difference signal X1, when the reference signal fr is advanced with respect to the compared signal fp by a predetermined phase, is substantially the same as that of when the reference signal fr is delayed with respect to the compared signal fp by the predetermined phase. Accordingly, the third phase difference signal X1 contains only information representing a phase difference between the reference signal fr and the compared signal fp.

The clock generator 43 receives the first and second phase difference signals φR, φP, and produces a detection clock signal X2 synchronized with either phase difference signals φR, φP. The detection clock signal X2 is synchronized with the third phase difference signal X1. The clock generator 43 delivers the detection clock signal X2 to the status detector 44 and the locking counter 45.

The status detector 44 receives the third phase difference signal X1 and the detection clock signal X2, and produces a status signal X3 on the basis of the third phase difference signal X1. The status detector 44 operates in synchronism with the detection clock signal X2, delivering the status signal X3 to the locking counter 45.

Each of the third phase difference signal X1 and the detection clock signal X2 is produced on the basis of the first and second phase difference signals φR, φP, which in turn corresponds to the phase difference between the reference signal fr and the compared signal fp. Accordingly, the status signal X3 corresponds to the phase difference between the reference signal fr and the compared signal fp or the status (locked or unlocked status) of the PLL circuit 40. It is to be understood that a locked status refers to a condition where the magnitude of a phase difference between the reference signal fr and the compared signal fp lies within a predetermined range while an unlocked status refers to a condition where the magnitude of the phase difference is out of the predetermined range.

The locking counter 45 receives the detection clock signal X2 and the status signal X3, and counts the number of pulses of the detection clock signal X2 while the status signal X3 is at a locked status (the L level signal). The locking counter 45 delivers a locked status detection signal LD having an H level on the basis of a count therein, i.e., when a given number of status signals X3, each corresponding to a locked status, are consecutively input. This prevents the locking detection signal LD from being delivered from the locking counter 45 for an accidental phase coincidence between the reference signal fr and the compared signal fp.

Figure 5:
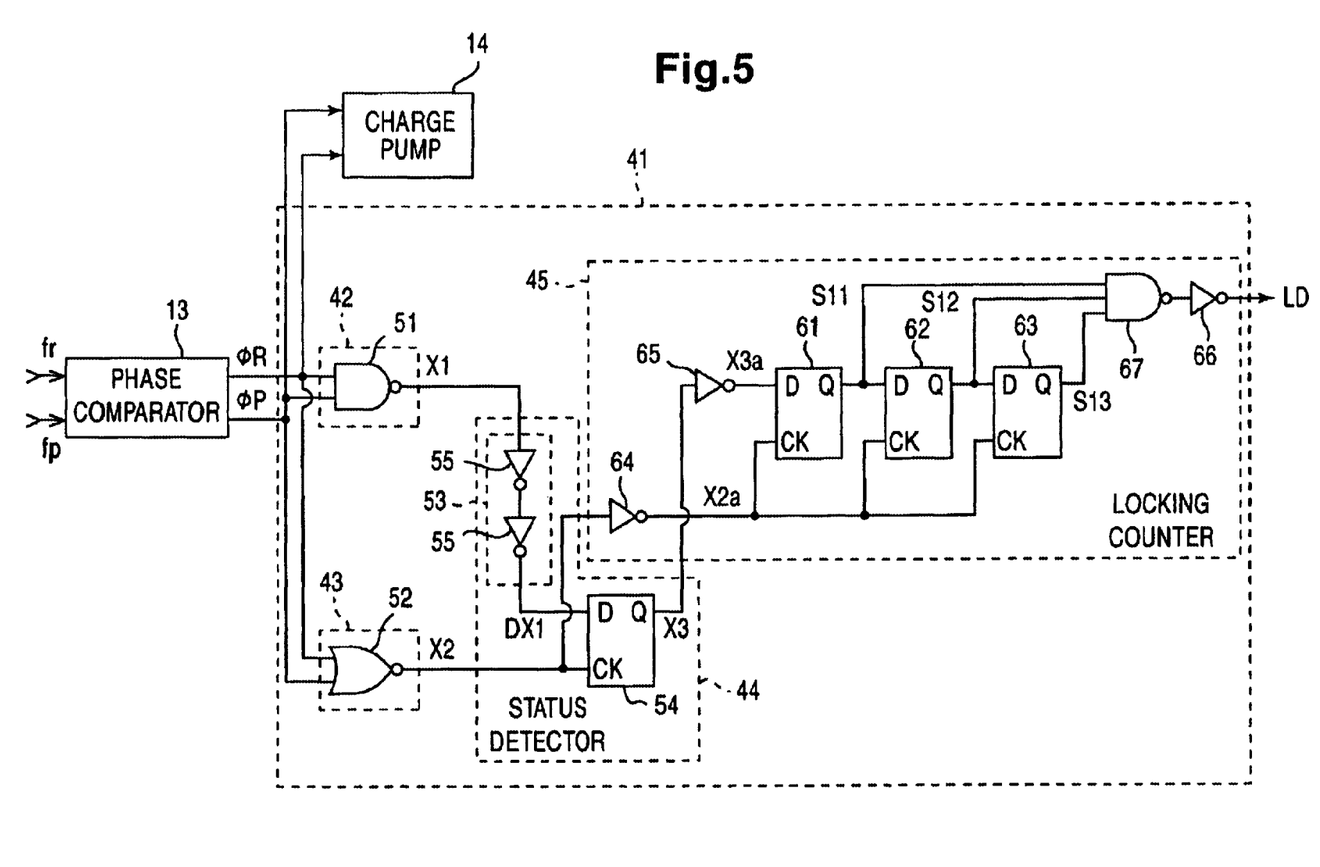
FIG. 5 is a circuit diagram of a lock detection circuit according to the first embodiment of the invention.

Referring to FIG. 5, a specific arrangement of the lock detection circuit 41 will be described. As shown in FIG. 5, the phase difference detector 42 comprises a NAND circuit 51, which receives the first and second phase difference signals φR, φP from the phase comparator 13. The clock generator 43 comprises a NOR circuit 52, which also receives the first and the second phase difference signals φR, φP from the phase comparator 13.

Figure 6:
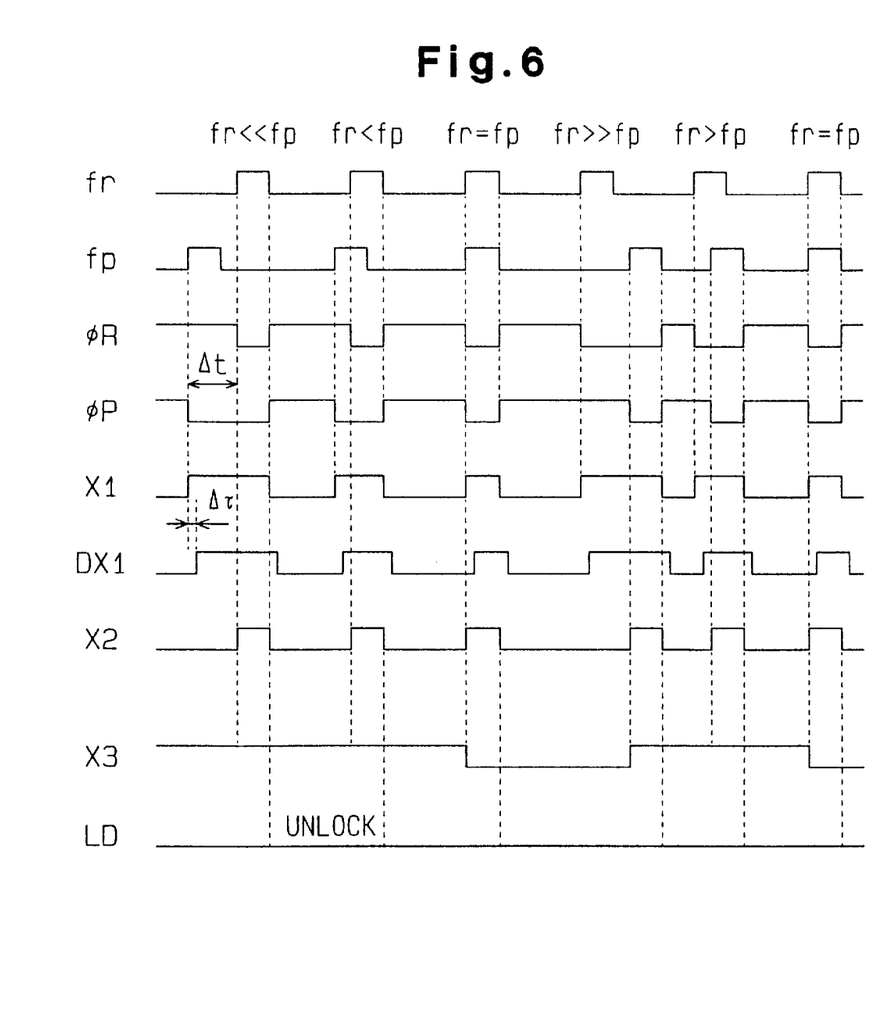
FIG. 6 is a first series of timing charts illustrating the operation of the lock detection circuit of FIG. 5.

The pulse width of each of the first and second phase difference signals φR, φP corresponds to the phase difference between the reference signal fr and the compared signal fp. More specifically, the time interval Δt during which either one of the first and second phase difference signals φR, φP assumes an L level represents the phase difference between the reference signal fr and the compared signal fp. The NAND circuit 51 generates a third phase reference signal X1 having an H level when at least one of the first and second phase difference signals φR, φP assumes an L level (FIG. 6). When both the first and the second phase difference signals φR, φP assume an L level, the NOR circuit 52 generates a detection clock signal X2 having an H level.

Accordingly, when the reference signal fr and the compared signal fp are phase offset from each other, the third phase difference signal X1 is delivered earlier than the detection clock signal X2. As shown in FIG. 6, a difference Δt (in absolute value) between a time interval during which the third phase difference signal X1 assumes an H level and a time interval during which the detection clock signal X2 assumes an H level represents a phase difference between the reference signal fr and the compared signal fp. In other words, the clock generator 43 delivers a detection clock signal X2 which is delayed by a time difference Δt, representing a phase difference between the reference signal fr and the compared signal fp, with respect to the third phase difference signal X1.

The status detector 44 comprises a delay circuit 53 and a data flip-flop circuit (hereafter simply referred to as FF circuit) 54. The delay circuit 53 is preferably formed by an even number of (two in FIG. 5) of inverter circuits 55 connected in series. The delay circuit 53 receives the third phase difference signal X1, delays it by a time interval Δτ (see FIG. 6) which depends on the number of inverter circuits 55, and delivers the delayed signal DX1 to the FF circuit 54. In other words, the delay circuit 53 delivers the delayed signal DX1 which is delayed by a delay time Δτ with respect to the third phase difference signal X1.

The FF circuit 54 has a data terminal which receives the delayed signal DX1, and a clock terminal which receives the detection clock signal X2, and provides the status signal X3 at its output terminal Q in synchronism with the rising edge of the detection clock signal X2.

As shown in FIG. 6, the rising edge of the detection clock signal X2 is delayed by the time difference Δt with respect to the rising edge of the third phase reference signal X1. On the other hand, the rising edge of the delayed signal DX1 is delayed by the delay time Δτ than the rising edge of the third phase difference signal X1.

When the delay time Δτ is less than the time difference Δt, the FF circuit 54 receives the delayed signal DX1 of an H level earlier than the rising edge of the detection clock signal X2, causing the FF circuit 54 to deliver the status signal X3 of an H level. On the other hand, when the delay time Δτ is greater than the time difference Δt, the FF circuit 54 receives the rising edge of the detection clock signal X2 earlier than the delayed signal DX1 having an H level, causing the FF circuit 54 to deliver the status signal of X3 having an L level. The status signal X3 having an H level represents a reduced phase offset between the reference signal fr and the compared signal fp, <and the PLL circuit 40 is then in a locked condition.

Accordingly, when the delay time Δτ is increased, the status detector 44 delivers the detection signal X3 having the L level, representing a locked condition, if there is an increased phase difference between the reference signal fr and the compared signal fp. Thus, the delay time Δτ determines a range of phase difference between the reference signal fr and the compared signal fp in which the status signal X3 is delivered, representing a locked condition, or determining the accuracy of a detection.

The locking counter 45 is preferably a synchronous counter having a given number of counter stages (which are three in the present embodiment). In the presently preferred embodiment, the locking counter 45 comprises three FF circuits 61, 62, 63, three inverter circuits 64, 65, 66 and a NAND circuit 67.

Each of the FF circuit 61 to 63 has a clock terminal which receives an inverted clock signal X3a, formed from the reference clock signal X2 by the inverter circuit 64. The first stage FF circuit 61 has a data terminal D which receives an inverted signal X3a, formed from the status signal X3 by the inverter circuit 65. The output terminal Q of the first stage FF circuit 61 is connected to the data terminal D of the second stage FF circuit 62, the output terminal Q of which is connected to the data terminal D of the final stage FF circuit 63. Each of the FF circuits 61 to 63 delivers a signal S11, S12, or S13, respectively, which depends on the input signals X2a, X3a at its output terminal Q in synchronism with the rising edge of the inverted clock signal X2a or the falling edge of the detection clock signal X2. The NAND circuit 67 receives the output signals S11 to S13 from the FF circuits 61 to 63, and generates a signal having an L level in response to the output signals S11 to S13 which have an H level. The inverter circuit 66 inverts the signal from the NAND circuit 67 to generate a locking detection signal LD.

The operation of the lock detection circuit 41 constructed in the manner mentioned above will now be described with reference to the series of timing charts shown in FIGS. 6 and 7.

When the frequency of the output signal fv is higher than the desired frequency:

The frequency of the compared signal fp is higher than the frequency of the reference signal fr (fr<<fp). As shown in FIG. 6, the phase comparator 13 receives the rising edge of the compared signal fp earlier than the rising edge of the reference signal fr. The phase comparator 13 generates the first and the second phase difference signals φR, φP each having an L level and each in synchronism with the rising edge of each of the reference signal fr and the compared signal fp. Specifically, the phase comparator 13 generates the second phase difference signal φP having an L level earlier than the first phase difference signal φR.

At a given time interval after generating the phase difference signals φR, φP both having an L level, the phase comparator 13 generates the phase difference signals φR, φP both having an H level simultaneously. Accordingly, in this instance, the pulse width of the second phase difference signal φP is longer than the pulse width of the first phase difference signal φR by an amount corresponding to a phase difference (or frequency difference) between the reference signal fr and the compared signal fp.

The phase difference detector 42 produces a third phase difference signal X1 which corresponds to the phase difference between the reference signal fr and the compared signal fp on the basis of the first and the second phase difference signals φR, φP. In the present example, the phase difference detector 42 generates the third phase difference X1 having an H level in response to the second phase difference signal φP having the L Level, and generates the third phase difference signal X1 having the L level in response to the first and the second phase difference signals φR, φP both having the H level.

The clock generator 43 produces the detection clock signal X2 synchronized with the phase difference signals φR, φP on the basis of the first and the second phase difference signals φR, φP. Specifically, as long as the phase difference signals φR, φP both having an L level are input, the clock generator 43 provides the detection clock signal X2 having the H level. In this instance, the clock generator 43 provides the detection clock signal X2 having the H level which is synchronized with the signal φR in response to the first phase difference signal φR having the L level.

The delay circuit 53 in the status detector 44 produces the delayed signal DX1 which corresponds to the third phase difference signal X1 delayed by the given delay time Δτ, and delivers it to the FF circuit 54, which then provides the status signal X3 having an L level which corresponds to the delayed signal DX1 in synchronism with the rising edge of the detection clock signal X2.

When the time difference Δτ and the delay time Δγ are related such that $$\Delta\tau << \Delta t \quad (1)$$

the FF circuit 54 receives the delayed signal DX1 having the H level in response to the rising edge of the detection clock signal X2.

Accordingly, the FF circuit 54 generates the status signal X3 having the H level in response to the delayed signal DX1 having the H level. The locking counter 45 generates the locking detection signal LD having an L level in response to the status signal X3 having the H level. The locking detection signal LD having the L level represents the detection of an unlocked condition of the PLL circuit 40.

As the frequency of the output signal fv is reduced and approaches the desired frequency (fr<<fp), the difference between the time reference Δt and the delay time Δτ is reduced. However, if the time difference Δt and the delay time Δτ are related such that $$\Delta\tau < \Delta t \quad (2)$$

the FF circuit 54 receives the delayed signal DX1 having the H level in response to the rising edge of the detection clock signal X2. Accordingly, the FF circuit 54 provides the status signal X3 having the H level in response to the delayed signal DX1 having the H level. Since the FF circuits 61 to 63 in the respective stages provide signals S11 to S13 each having an L level in response to the status signal X3 having the H level, the locking counter 45 generates a locking detection signal LD having an L level. The locking detection signal LD having an L level represents the detection of an unlocked condition of the PLL circuit 40 shown in FIG. 4.

As the frequency of the output signal fv is further reduced and becomes coincident with the desired frequency (fr=fp), the time difference Δt becomes zero, and hence the time difference Δt and the delay time Δτ are related such that $$\Delta\tau > \Delta t. \quad (3)$$

Since the first and the second phase difference signals φR, φP have their falling edges coincident, the rising edge of the third phase difference signal X1 and the rising edge of the detection clock signal X2 also coincide. Because the rising edge of the delayed signal DX1 is delayed by the delay time Δτ from the third phase difference signal X1, the FF circuit 54 receives the delayed signal DX1 having an L level in response to the rising edge of the detection clock signal X2. Thus, the FF circuit 54 provides the status signal X having an L level in a manner corresponding delayed signal DX1 having an L level. The first stage FF circuit 61 in the locking counter 45 delivers the signal S11 having an H level in response to the status signal X3 having an L level. Subsequent FF circuits 62, 63 deliver the signals S12, S13 each having an L level. In this manner, the locking counter 45 generates the locking detection signal LD having an L level.

During a shift from an unlocked to a locked condition:

When the time difference Δt is less than the delay time Δτ, the FF circuit 54 delivers the status signal X3 having an L level in response to the delayed signal DX1 having an L level in synchronism with the rising edge of the detection clock signal X2.

The FF circuit 61 in the locking counter 45 receives the inverted signal X3a having an H level, which is formed by an inversion of the status signal X3 by the inverter circuit 65, at its data terminal D, and delivers the signal S11 having an H level in synchronism with the rising edge of the inverter clock signal X2a or the falling edge of the detection clock signal X2.

The FF circuit 62 receives the signal S11 from the FF circuit 61 at its data terminal D, and delivers the signal S12 having an H level which corresponds to the output signal S11 having the H level in synchronism with the falling edge of the detection clock signal X2. Similarly, the FF circuit 63 receives the signal S12 from the FF circuit 62 at its data terminal D, and delivers the signal S13 having an H level in synchronism with the falling edge of the detection clock signal X2.

In this manner, the FF circuits 61 to 63 transmit the inverted signal X3a having the H level each time the falling edge of the detection clock signal X2 is applied thereto. Consequently, when the FF circuits 61 to 63 deliver the signals S11 to S13 having the H level, the NAND circuit 67 generates a signal having an L level, which is inverted by the inverter circuit 66 to deliver a locking detection signal LD having an H level.

When the lock detection circuit 41 receives a number of falling edges of the detection clock signal X2, which corresponds to the number of stages in the synchronous counter 45, during the time interval when the reference signal fr and the compared signal fp coincide in frequency and the status detector 44 generates the status signal X3 having an L level, the lock detection circuit 41 provides the locking detection signal LD having an H level, which represents the detection of a locked condition of the PLL circuit 40.

Figure 7:
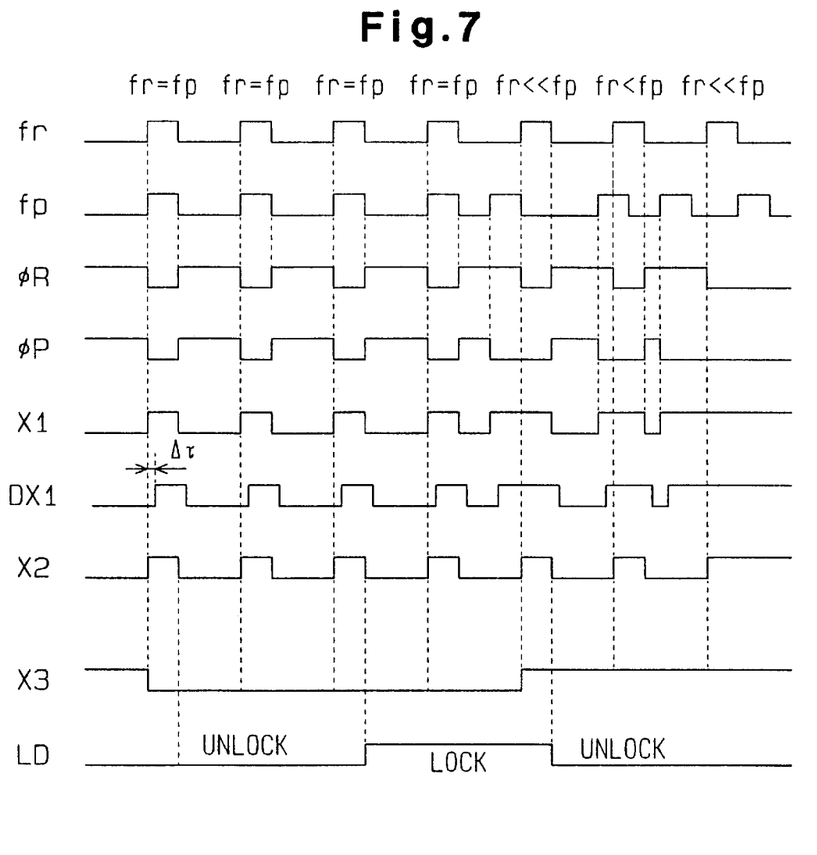
FIG. 7 is another series of timing charts also illustrating the operation of the lock detection circuit.

During a shift from a locked to an unlocked condition:

If a frequency offset between the reference signal fr and the compared signal fp occurs and the PLL circuit 40 is locked, for example, when the frequency of the compared signal fp becomes higher than the frequency of the reference signal fr (fr<<fp) as considered in FIG. 7, the FF circuit 54 receives the delayed signal DX1 having an H level in response to the rising edge of the detection clock signal X2. Accordingly, the FF circuit 54 delivers the status signal X3 having an H level which corresponds to the delayed signal DX1 in synchronism with the rising edge of the detection clock signal X2.

The FF circuit 61 receives the inverted signal X3a having an L level formed from the status signal X3 by the inverter circuit 65, and delivers the signal S11 having an L level which corresponds to the inverted signal X3a in synchronism with the falling edge of the detection clock signal X2. The NAND circuit 67 generates a signal having an H level in response to the output signal S11 having the L level, and accordingly, the inverter circuit 66 provides the locking detection signal LD having an L level.

Accordingly, the lock detection circuit 41 immediately delivers the locking detection signal LD having an L level whenever there occurs a phase offset between the reference signal fr and the compared signal fp which exceeds a given amount. The locking detection signal LD having the L level represents the detection of an unlocked condition of the PLL circuit 40, which is thus immediately detected.

When the frequency of the output signal fv is lower than the desired frequency:

At this time, the frequency of the compared signal fp is below the frequency of the reference signal fr (fr>>fp). The phase comparator 63 receives the rising edge of the reference signal fr before the rising edge of the compared signal fp, and generates the first and the second phase difference signals φR, φP both having an L level in synchronism with the rising edges of the reference signal fr and the compared signal fp, respectively. In other words, the phase comparator 13 generates the first phase difference signal φR having an L level earlier than it generates the second phase difference signal φP.

At a given time interval after delivering the phase difference signals φR, φP both having an L level, the phase comparator 13 generates the phase difference signals φR, φP both having an H level simultaneously. Accordingly, in this instance, the pulse width of the first phase difference signal φR is longer than the pulse width of the second phase difference signal φP by an amount corresponding to the phase difference (frequency difference) between the reference signal fr and the compared signal fp.

On the basis of the first and the second phase difference signals φR, φP, the phase difference detector 42 produces the third phase difference signal X1 which corresponds to the phase difference between the reference signal fr and the compared signal fp. The third phase difference signal X1 does not contain information indicating which one of the reference signal fr and the compared signal fp leads in phase, but only indicates the absolute value of the phase difference between the reference signal fr and the compared signal fp. In this instance, the operation is similar to the operation mentioned above which occurs when the frequency of the compared signal fp is higher than the frequency of the reference signal fr, and accordingly, further description is omitted, as it will be understood by those of ordinary skill in the art.

As described, in the present embodiment, the lock detection circuit 41 detects a locked or an unlocked condition independently from the frequencies of the reference signal fr and the compared signal fp. As a consequence, if the frequencies of the reference signal fr and the compared signal fp increase, the lock detection circuit 41 is capable of detecting a locked condition in a stable manner on the basis of the detection clock signal X2 which is synchronized with the third phase difference signal X1. Thus, the PLL circuit 40 can accommodate for an output signal fv of a high frequency than the prior art circuits.

It should be apparent to those skilled in the art that the present invention may be embodied in many other specific forms without departing from the spirit or scope of the invention. Particularly, it should be understood that the invention may be embodied in the following forms.

Specifically, in the embodiment described above, the number of stages in the delay circuit 53 or the driving capability of the inverter circuit 55 may be modified to change the delay time Δτ.

Figure 8:
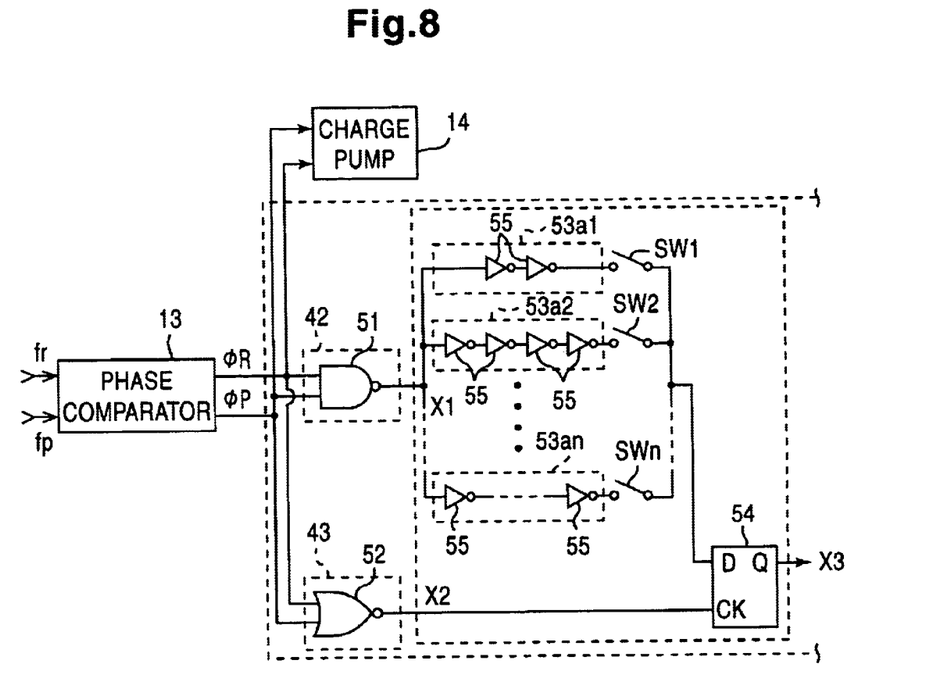
FIG. 8 is a circuit diagram of part of a lock detection circuit according to an alternative embodiment of the invention.

Alternatively, a plurality of delay circuits 53a1–53an having different delay times, as shown in FIG. 8, may be provided. These delay circuits 53a1–53an are connected in parallel to each other, and switches SW1-SWn are connected in series with the individual delay circuits 53a1–53an. In this arrangement, one of the switches SW1-SWn may be selectively turned on external to the chip, thus selecting any desired delay time. As a result, a locking detection signal LD is provided which is based on the relationship of the time difference Δt between the phases of the reference signal fr and the compared signal fp relative to the selected delay time. In this manner, the accuracy of detection of the locking detection signal LD can be,changed.

Also in the described embodiment, the locking counter 45 may include a number of stages which is equal to two or four or more. A two stage locking counter 45 exhibits a simple circuit arrangement. A locking counter 45 having four or more stages delivers the locking detection signal LD after the locked condition has been confirmed in more than three stages.

Additionally, in the described embodiment, the phase difference detector 42, the clock generator 43 and the status detector 44 may be suitably modified in circuit arrangement. Alternatively, the locking counter 45 may be omitted while the status signal X3 from the status detector 44 is provided as the locking detection signal LD. Such omission of the locking counter 45 simplifies the circuit arrangement Therefore, the present examples and the embodiments are to be considered as illustrative and not restrictive and the invention is not to be limited to the details given herein, but may be modified within the scope and the equivalence of the appended claims.

What is claimed is:

1. A lock detection circuit for detecting whether a phase of a compared signal is locked with that of a reference signal based on first and second phase difference signals, wherein the first phase difference signal corresponds to the reference signal having a reference frequency obtained by frequency-demultiplying an oscillation signal having a predetermined frequency and the second phase difference signal corresponds to the compared signal having a preset frequency obtained by frequency-demultiplying a frequency signal of a voltage control oscillator, and wherein the first and second phase difference signals include a first information indicative of a phase difference between the reference signal and the compared signal and second information indicating of the signal which leads in phase, wherein one of the first and second phase difference signals, which leads in phase, is inverted faster than another one of the first and second phase difference signals, and then the both of the first and second phase difference signals are recovered substantially simultaneously after a predetermined time is elapsed, the lock detection circuit comprising:

a clock generating unit for receiving the first and the second phase difference signals and generating a detecting clock signal in synchronism with the first and second phase difference signals, based on the first and second phase difference signals; and a lock detecting unit for receiving the first and the second phase difference signals and the detecting clock signal, and detecting whether or not the phase of the compared signal is locked with the phase of the reference signal based on the first and the second phase difference signals in synchronism with the detecting clock signal, and generating a lock detecting signal, wherein the lock detecting unit includes a status detecting circuit for receiving the detecting clock signal and generating a status signal based on the first and second phase difference signals in synchronism with the detecting clock signal.

2. The lock detection circuit according to claim 1, wherein the trailing edge of the first phase difference signal corresponds to the leading edge of the reference signal, and the trailing edge of the second phase difference signal corresponds to the leading edge of the compared signal.

3. A lock detection circuit for detecting whether a phase of a compared signal is locked with that of a reference signal based on first and second phase difference signals, wherein the first phase difference signal corresponds to the reference signal having a reference frequency obtained by frequency-demultiplying an oscillation signal having a predetermined frequency and the second phase difference signal corresponds to the compared signal having a preset frequency obtained by frequency-demultiplying a frequency signal of a voltage control oscillator, and wherein the first and second phase difference signals include first information indicative of a phase difference between the reference signal and the compared signal and second information indicative of the signal which leads in phase, wherein one of the first and second phase difference signals which leads in phase, is inverted faster than another one of the first and second phase difference signals, and then the both of the first and second phase difference signals are recovered substantially simultaneously after a predetermined time is elapsed, the lock detection circuit comprising:

a clock generating unit for receiving the first and the second phase difference signals and generating a detecting clock signal in synchronism with the first and the second phase difference signals, based on the first and the second phase difference signals; and a lock detecting unit for receiving the first and the second phase difference signals and the detecting clock signal, and detecting, in synchronism with the detecting clock signal, whether the phase of the compared signal is locked with the phase of the reference signal based on the first and the second phase difference signals, and generating a lock detecting signal, wherein the lock detecting unit comprises:

a phase difference detecting circuit for receiving the first and the second phase difference signals, and generating a third phase difference signal corresponding to the phase difference between the reference signal and the compared signal, based on the first and the second phase difference signals; and a status detecting circuit for receiving the third phase difference signal and the detecting clock signal, and generating a status signal, in synchronism with the detecting clock signal.

4. The lock detection circuit according to claim 3, wherein the status detecting circuit includes a delay circuit for generating a delay signal by delaying the third difference signal by a predetermined time interval, and wherein the status detecting circuit generates the status signal based on the delay signal.

5. The lock detection circuit according to claim 4, wherein the status detecting circuit outputs the status signal representing the temporary locked state when the time interval corresponding to the phase difference between the reference signal and the compared signal is within a predetermined time interval.

6. The lock detection circuit according to claim 5, wherein the predetermined time interval is determined by the delay time of the delay circuit.

7. The lock detection circuit according to claim 3, wherein the status detecting circuit comprises a plurality of delay circuits for generating delay signals by delaying the third phase difference signal by a predetermined time interval, each delay signal being delayed from one another by a different time period, and wherein the status detecting circuit generates the status signal, in synchronism with the detecting clock signal, when the phase of the compared signal is locked with that of the reference signal based on one of the delayed signals.

8. The lock detection circuit according to claim 4, wherein the status detecting circuit generates the status signal representing a temporary locked state when a time interval corresponding to the phase difference between the reference signal and the compared signal is within a predetermined time interval.

9. The lock detection circuit according to claim 8, wherein the predetermined time interval is determined by the delay time of one of the delay circuits.

10. The lock detection circuit according to claim 3, further comprising a lock counter for receiving the detecting clock signal and the status signal, counting the detecting signal while the status signal represents the temporary locked state, and generating the lock detecting signal when a counting value reaches to a predetermined value.

11. A PLL synthesizer comprising:
a voltage control oscillator for generating a frequency signal corresponding to a value of a control voltage signal;
a comparison frequency demultiplier for generating a compared signal having a preset frequency by frequency-demultiplying the frequency signal from the voltage control oscillator;
a reference frequency demultiplier for generating a reference signal having a reference frequency by frequency-demultiplying an oscillation signal having a predetermined frequency;
a phase comparator for receiving the reference signal and the compared signal to compare the phases thereof, and generating first and second phase difference signals, wherein the first phase difference signal corresponds to the reference signal and the second phase difference signal corresponds to the compared signal, and wherein the first and second phase difference signals include first information indicative of a phase difference between the reference signal and the compared signal and second information indicative of the signal which leads in phase, based on a result of the phase comparison, wherein one of the first and second phase difference signals, which leads in phase, is inverted faster than another one of the first and second phase difference signals, and then the both of the first and second phase difference signals are recovered substantially simultaneously after a predetermined time is elapsed;
a charge pump for converting the first and the second phase difference signals from the phase comparator to a voltage signal;
a low pass filter for receiving the voltage signal from the charge pump and generating the control voltage signal provided to the voltage control oscillator; and
a lock detection circuit for detecting whether or not a phase of the compared signal is locked with a phase of the reference signal based on the first and second phase difference signals and generating a lock detecting signal, the lock detecting circuit comprising:
a clock generating unit for receiving the first and the second phase difference signals and generating a detecting clock signal in synchronism with the first and the second phase difference signals, based on the first and the second phase difference signals; and
a lock detecting unit for receiving the first and the second phase difference signals and the detecting clock signal, and detecting whether the phase of the compared signal is locked with the phase of the reference signal based on the first and the second phase difference signals in synchronism with the detecting clock signal, and generating a lock detecting signal,
wherein the lock detecting unit includes a status detecting circuit for receiving the detecting clock signal and generating a status signal based on the first and second phase difference signals in synchronism with the detecting clock signal.

12. The lock detection circuit according to claim 11, wherein the trailing edge of the first phase difference signal corresponds to the leading edge of the reference signal, and the trailing edge of the second phase difference signal corresponds to the leading edge of the compared signal.

13. A PLL synthesizer comprising:
a voltage control oscillator for generating a frequency signal corresponding to a value of a control voltage signal;
a comparison frequency demultiplier for generating a compared signal having a preset frequency by frequency-demultiplying the frequency signal from the voltage control oscillator;
a reference frequency demultiplier for generating a reference signal having a reference frequency by frequency-demultiplying an oscillation signal having a predetermined frequency;
a phase comparator for receiving the reference signal and the compared signal to compare the phases thereof, and generating first and second phase difference signals, wherein the first phase difference signal corresponds to the reference signal and the second phase difference signal corresponds to the compared signal, and
wherein the first and second phase difference signals include first information indicative of a phase difference between the reference signal and the compared signal and second information indicative of the signal which leads in phase, based on a result of the phase comparison, wherein one of the first and second phase difference signals, which leads in phase, is inverted faster than another one of the first and second phase difference signals, and then the both of the first and second phase difference signals are recovered substantially simultaneously after a predetermined time is elapsed;
a charge pump for converting the first and the second phase difference signals from the phase comparator to voltage signal;
a low pass filter for receiving the voltage signal from the charge pump and generating the control voltage signal provided to the voltage control oscillator; and
a lock detection circuit including
a clock generating unit for receiving the first and the second phase difference signals and generating a detecting clock signal in synchronism with the first and the second phase difference signals, based on the first and the second phase difference signals, and
a lock detecting unit for receiving the first and the second phase difference signals and the detecting clock signal, and detecting, in synchronism with the detecting clock signal, whether the phase of the compared signal is locked with the phase of the reference signal based on the first and the second phase difference signals, and generating a lock detecting signal,
wherein the lock detecting unit comprises:
a phase difference detecting circuit for receiving the first and the second phase difference signals, and generating a third phase difference signal corresponding to the phase difference between the reference signal and the compared signal, based on the first and the second phase difference signals; and
a status detecting circuit for receiving the third phase difference signal and the detecting clock signal, and generating a status signal, in synchronism with the detecting clock signal.

14. The PLL frequency synthesizer according to claim 13, wherein the status detecting circuit includes a delay circuit for generating a delay signal by delaying the third difference signal by a predetermined time interval, and wherein the status detecting circuit generates the status signal based on the delay signal.

15. The PLL frequency synthesizer according to claim 14, wherein the status detecting circuit outputs the status signal representing the temporary locked state when the time interval corresponding to the phase difference between the reference signal and the compared signal is within a predetermined time interval.

16. The PLL frequency synthesizer according to claim 15, wherein the predetermined time interval is determined by the delay time of the delay circuit.

17. The PLL frequency synthesizer according to claim 13, wherein the status detecting circuit comprises a plurality of delay circuits for generating delay signals by delaying the third phase difference signal by a predetermined time interval, each delay signal being delayed by a different time period, and wherein the status detecting circuit generates the status signal, in synchronism with the detecting clock signal, when the phase of the phase of the compared signal is locked with that of the reference signal based on one of the delayed signals.

18. The PLL frequency synthesizer according to claim 17, wherein the status detecting circuit generates the status signal representing a temporary locked state when a time interval corresponding to the phase difference between the reference signal and the compared signal is within a predetermined time interval.

19. The PLL frequency synthesizer according to claim 18, wherein the predetermined time interval is determined by the delay time of one of the delay circuits.

20. The PLL frequency synthesizer according to claim 13, further comprising a lock counter for receiving the detecting clock signal and the status signal, counting the detecting signal while the status signal represents the temporary locked state, and generating the lock detecting signal when a counting value reaches a predetermined value.

21. A lock detection circuit for use with a frequency synthesizer for detecting a locked condition of the synthesizer, the synthesizer including a phase comparator which receives a reference signal and a compared signal and generates first and second phase difference signals therefrom, the lock detection circuit comprising:

a phase difference detector which receives the first and second phase difference signals and generates a third phase difference signal which depends on a pulse width of each of the first and second phase difference signals;

a clock generator circuit which receives the first and second phase difference signals and produces a detection clock signal synchronized with the third phase difference signal;

a plurality of delay circuits connected in parallel with each other and in series with the phase difference detector, each of the delay circuits receiving the third phase difference signal and delaying the third phase difference signal by a different delay time;

a plurality of switches connected in series with the plurality of delay circuits;

a flip-flop circuit having a data input connected to the delay circuits for receiving the third phase difference signal delayed by a predetermined time period, a clock input connected to the clock generator circuit for receiving the detection clock signal, and a data output for providing a status signal, wherein one of the plurality of switches is selectively turned on to delay the third phase difference signal by a selected predetermined time period; and a locking counter connected to a data output of the flip-flop circuit for receiving the status signal and connected to the clock generator circuit for receiving the detection clock signal, the locking counter counting a number of pulses of the detection clock signal while the status signal is at a predetermined level and generating a locking detection signal therefrom, the locking detection signal indicating locked condition of the synthesizer.

\* \* \* \* \*